(12) United States Patent
Hao

(10) Patent No.: US 9,971,221 B2
(45) Date of Patent: May 15, 2018

(54) LIQUID CRYSTAL DISPLAY PANEL, ARRAY SUBSTRATE AND MANUFACTURING METHOD FOR THE SAME

(71) Applicant: Shenzhen China Star Optoelectronics Technology Co., Ltd., Shenzhen, Guangdong (CN)

(72) Inventor: Sikun Hao, Guangdong (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 242 days.

(21) Appl. No.: 14/913,998

(22) PCT Filed: Jan. 29, 2016

(86) PCT No.: PCT/CN2016/072667
§ 371 (c)(1),
(2) Date: Feb. 24, 2016

(87) PCT Pub. No.: WO2017/117835
PCT Pub. Date: Jul. 13, 2017

(65) Prior Publication Data
US 2018/0039115 A1    Feb. 8, 2018

(30) Foreign Application Priority Data

Jan. 5, 2016 (CN) .......................... 2016 1 0006137

(51) Int. Cl.
G02F 1/1335    (2006.01)
G02F 1/1368    (2006.01)
(Continued)

(52) U.S. Cl.
CPC ........ G02F 1/1368 (2013.01); G02F 1/13394 (2013.01); G02F 1/136209 (2013.01);
(Continued)

(58) Field of Classification Search
CPC ............... G02F 1/1368; G02F 1/13394; G02F 1/136209; G02F 1/136227;
(Continued)

(56) References Cited

U.S. PATENT DOCUMENTS 6,256,079 B1 * 7/2001 Matsushima ..... G02F 1/133516
349/106
8,107,047 B2 * 1/2012 Song ................... G02F 1/13394
349/106
(Continued)

FOREIGN PATENT DOCUMENTS

CN    101364014    2/2009
CN    104035231    9/2014
(Continued)

*Primary Examiner* — Hoan C Nguyen
(74) *Attorney, Agent, or Firm* — Andrew C. Cheng

(57) ABSTRACT

A manufacturing method for an array substrate is provided. A protrusion column is formed through a mask process of a color filter film and a mask process of a black matrix, and using the protrusion column to realize the function of a Sub PS so that a mask for manufacturing the Sub PS is not required in order to reduce the type and the number of the masks for manufacturing the PS, simplify the manufacturing process, and decrease the production cost. The present invention also provides an array substrate and a liquid crystal display panel adopting the above manufacturing method.

9 Claims, 2 Drawing Sheets

(51) Int. Cl.
*G02F 1/1362* (2006.01)
*G02F 1/1339* (2006.01)

(52) U.S. Cl.
CPC .. *G02F 1/136227* (2013.01); *G02F 1/136286* (2013.01); *G02F 2001/13398* (2013.01); *G02F 2001/136222* (2013.01); *G02F 2001/136231* (2013.01); *G02F 2001/136295* (2013.01); *G02F 2201/123* (2013.01)

(58) Field of Classification Search
CPC ..... G02F 1/136286; G02F 2001/13398; G02F 2001/136222; G02F 2001/136231; G02F 2001/136295; G02F 2201/123
USPC ........................................................ 349/106
See application file for complete search history.

(56) References Cited

U.S. PATENT DOCUMENTS

| | | | |
|---|---|---|---|
| 2001/0012079 A1* | 8/2001 | Yamamoto | G02F 1/133514 349/106 |
| 2002/0089615 A1* | 7/2002 | Sakamoto | G02F 1/136209 349/43 |
| 2010/0165266 A1 | 7/2010 | Sakata et al. | |
| 2013/0250227 A1* | 9/2013 | Kira | G02F 1/1339 349/153 |
| 2016/0155908 A1 | 6/2016 | Song | |
| 2017/0147110 A1 | 5/2017 | Xu | |

FOREIGN PATENT DOCUMENTS

| | | |
|---|---|---|
| JP | 2006267524 | 10/2006 |
| KR | 20080034545 | 4/2008 |

\* cited by examiner

LIQUID CRYSTAL DISPLAY PANEL, ARRAY SUBSTRATE AND MANUFACTURING METHOD FOR THE SAME

BACKGROUND OF THE INVENTION

1. Field of the Invention

The present invention relates to a liquid crystal display technology field, and more particularly to an array substrate array, a manufacturing method for the same and a liquid crystal display panel having the array substrate.

2. Description of Related Art

A photo spacer (PS, photosensitive spacer) is used for supporting and maintaining a cell-gap of a liquid crystal cell of a liquid crystal display panel to be uniform. In a liquid crystal display panel based on the COA (Color Filter on Array, integrating the color filter on the array substrate) technology, a PS of liquid crystal display panel includes a main PS (Main Photo Spacer, main photosensitive spacer or main columnar spacer) and a sub PS (Sub Photo Spacer, auxiliary photosensitive spacer or auxiliary columnar spacer), and the main PS and the sub PS are all disposed on the color filter substrate and a height of the main PS is greater than a height the sub PS.

In order to realize the height difference of the main PS and the sub PS, the manufacturer usually adopts a Gray-tone mask or a Half-tone mask and through one mask process to form the main PS and the sub PS, or adopts two masks and through two mask processes to form the main PS and the sub PS. Because the liquid crystal display panel further includes a larger number of other layer structures so that how to reduce the type and the number of the mask for manufacturing the main PS and the sub PS in order to simplify the manufacturing process and reduce the production cost has become an urgent problem that need to be solved currently by the manufacturer.

SUMMARY OF THE INVENTION

Accordingly, the present invention provides a liquid crystal display panel, an array substrate and manufacturing method for the same, which can reduce the type and the number of the mask for manufacturing the PS and simplify the manufacturing process.

The present invention provides a manufacturing method for an array substrate, comprising: sequentially forming a gate electrode, an insulation layer and an active semiconductor layer on a base; forming a source electrode and a drain electrode on the active semiconductor layer; forming a signal line on the insulation layer; forming a color filter film above the source electrode, the drain electrode and the insulation layer, the color filter film includes a first color filter film and a second color filter film which are formed by a same mask, the first color filter film is provided with a contact hole that reveals a surface of the drain electrode, and the second color filter film is formed on the first color filter film and located above the source electrode and the drain electrode; and forming a black matrix on the color filter film, the black matrix includes a first black matrix and a second black matrix formed by a same mask, the first black matrix is formed on the first color filter film and correspondingly located above the signal line, the second black matrix is formed on the second color filter film and correspondingly located above the drain electrode and/or the source electrode; wherein, the second black matrix and the second color filter film form a protrusion column, and the protrusion column is higher than a top surface of the pixel electrode.

Wherein, the second color filter film is provided with a groove that reveals a surface of the first color filter film for receiving a photo spacer, and the photo spacer is located on a color filter substrate spaced relative to the array substrate.

Wherein, the first color filter film includes R, G and B color resists located on a same plane and formed by three exposure and development processes, and the second color filter film is formed by one of the three exposure and development processes.

Wherein, the source electrode, the drain electrode and the signal line are formed by a same mask.

The present invention provides an array substrate, comprising: a base; a gate electrode, an insulation layer, an active semiconductor layer which are sequentially formed on the base; a source electrode and a drain electrode formed on the active semiconductor layer; a signal line formed on the insulation layer; a color filter film formed above the source electrode, the drain electrode and the insulation layer, wherein the color filter film comprises a first color filter film and a second color filter film which are formed by a same mask, the first color filter film is provided with a contact hole that reveals a surface of the drain electrode, the second color filter film is formed on the first color filter film, and the second color filter film is located above the source electrode and the drain electrode; a black matrix formed on the color filter film, wherein the black matrix comprises a first black matrix and a second black matrix formed by a same mask, the first black matrix is formed on the first color filter film, and correspondingly located above the signal line, the second black matrix is formed on the second color filter film, and correspondingly located above the drain electrode and/or the source electrode; and a pixel electrode formed on the first color filter film and inside the contact hole, and the pixel electrode is electrically connected with the drain electrode through the contact hole; wherein, the second black matrix and the second color filter film form a protrusion column, and the protrusion column is higher than a top surface of the pixel electrode.

Wherein, the second color filter film is provided with a groove that reveals a surface of the first color filter film for receiving a photo spacer, and the photo spacer is located on a color filter substrate spaced relative to the array substrate.

Wherein, the first color filter film includes R, G and B color resists located on a same plane and formed by three exposure and development processes, and the second color filter film is formed by one of the three exposure and development processes.

Wherein, the source electrode, the drain electrode and the signal line are formed by a same mask.

The present invention provides a liquid crystal display panel, wherein, the liquid crystal display panel comprises a first substrate and a second substrate which are disposed at an interval and a liquid crystal filled between the first substrate and the second substrate, wherein, one of the first substrate and the second substrate is an array substrate, and the array substrate comprises: a base; a gate electrode, an insulation layer, an active semiconductor layer which are sequentially formed on the base; a source electrode and a drain electrode formed on the active semiconductor layer; a signal line formed on the insulation layer; a color filter film formed above the source electrode, the drain electrode and the insulation layer, wherein the color filter film comprises a first color filter film and a second color filter film which are formed by a same mask, the first color filter film is provided with a contact hole that reveals a surface of the drain electrode, the second color filter film is formed on the first color filter film, and the second color filter film is located above the source electrode and the drain electrode; a black matrix formed on the color filter film, wherein the black matrix comprises a first black matrix and a second black matrix formed by a same mask, the first black matrix is formed on the first color filter film, and correspondingly located above the signal line, the second black matrix is formed on the second color filter film, and correspondingly located above the drain electrode and/or the source electrode; and a pixel electrode formed on the first color filter film and inside the contact hole, and the pixel electrode is electrically connected with the drain electrode through the contact hole; wherein, the second black matrix and the second color filter film form a protrusion column, and the protrusion column is higher than a top surface of the pixel electrode.

Wherein, the other of the first substrate and the second substrate is provided with a photo spacer, the photo spacer is received in a groove, and a height of the photo spacer is greater than a height of the protrusion column.

Wherein, the first color filter film includes R, G and B color resists located on a same plane and formed by three exposure and development processes, and the second color filter film is formed by one of the three exposure and development processes.

Wherein, the source electrode, the drain electrode and the signal line are formed by a same mask.

In the liquid crystal display panel, array substrate and the manufacturing method for the same of the present invention, a protrusion column is formed through a mask process of a color filter film and a mask process of a black matrix, and using the protrusion column to realize the function of a PS (Sub PS) so that a mask for manufacturing the PS (including gray-tone mask or half-tone mask) is not required in order to reduce the type and the number of the masks for manufacturing the PS, simplify the manufacturing process, and decrease the production cost.

DETAILED DESCRIPTION OF THE PREFERRED EMBODIMENT

The following will combine the figures in the embodiment of the present invention to describe the technology solution of the exemplary embodiment of the present invention clearly and completely.

Figure 1:
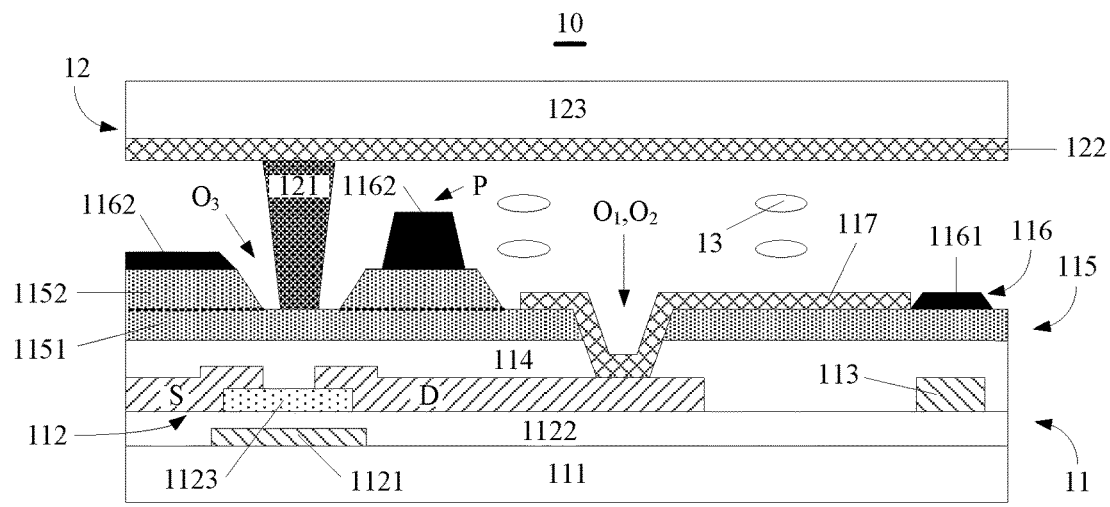
FIG. 1 is a structural cross-sectional view of a liquid crystal display panel of an embodiment of the present invention.

FIG. 1 is a structural cross-sectional view of a liquid crystal display panel of an embodiment of the present invention. As shown in FIG. 1, the liquid crystal display panel 10 includes an array substrate (also known as a Thin Film Transistor Substrate or a TFT substrate) 11 and a color filter (also known as a CF substrate or a color filter substrate) 12 which are disposed oppositely and a liquid crystal (liquid crystal molecules) 13 clamped between the array substrate 11 and the color filter substrate 12. Wherein, the liquid crystal 13 is located in a liquid crystal cell overlapped and combined by the array substrate 11 and the color filter substrate 12.

The array substrate 11 includes a base 111, a Thin Film Transistor (TFT) 112 formed on the base 111, a signal line 113, a PFA layer (Polytetrafluoro-Ethylene Layer, a planarization passivation layer or Polytetrafluoroethylene layer) 114, a color filter film 115, a black matrix 116 and a pixel electrode 117. Wherein, the TFT 112 includes a gate electrode 1121, an insulation layer 1122, and an active semiconductor layer (AS) 1123 which are sequentially formed on the base 111, and a source electrode S and a drain electrode D formed on the active semiconductor layer 1123. The insulation layer 1122 is a gate insulation layer (GI).

The signal line 113 is formed on the insulation layer 1122, and the signal line 113 can be a data line formed by a same mask process as the source electrode S and the drain electrode D, and the data line is disposed at an interval with the TFT 112 at a horizontal direction. The planarization passivation layer 114 is formed on the source electrode S, the drain electrode D, the signal line 113 and the insulation layer 1122. The planarization passivation layer 114 is provided with a first contact hole $O_1$ which reveals a surface of the drain electrode D. The color filter film 115 is formed on the planarization passivation layer 114, and the color filter film 115 is provided with a second contact hole $O_2$ which is communicated with the first contact hole $O_1$. The black matrix 116 is formed on the color filter 115. The pixel electrode 117 is formed on the color filter film 115 and inside the first contact hole $O_1$ and the second contact hole $O_2$. The pixel electrode 117 is electrically connected with the drain electrode D through the first contact hole $O_1$ and the second contact hole $O_2$.

The difference between the present invention and the conventional art is that in the embodiment of the present invention:

The color filter film 115 includes a first color filter film 1151 and a second color filter film 1152 which are formed by a same mask. Wherein, the first color filter film 1151 is the color filter film that located in an effective display region of a pixel of the conventional art. The first contact hole $O_1$ is formed in the first color filter film 1151. The second color filter film 1152 is formed on the first color filter film 1151, and the second color filter film 1152 is located above the TFT 112.

The black matrix 116 includes a first black matrix 1161 and a second black matrix 1162 which are formed by a same mask. Wherein, the first black matrix 1161 and the second black matrix 1162 are both black matrixes used in the conventional art for light shielding. The difference is that a maximum height of the second black matrix 1162 is greater than the conventional art. The first black matrix 1161 is formed on the first color filter film 1151 which is not covered by the second color filter film 1152, and correspondingly located above the signal line 113. The second black matrix 1162 is formed on the second color filter film 1152, and located correspondingly above the TFT 112.

Wherein, the second color filter film 1152 is provided with a groove $O_3$ that reveals a surface of the first color filter film 1151. The groove $O_3$ is used for receiving a photo spacer 121 (Main PS) located on the color filter substrate 12. One portion of the second black matrix 1162 is correspondingly located above the source electrode S, and the other portion of the second black matrix 1162 is correspondingly located above the drain electrode D. Accordingly, the maximum height of the second black matrix 1162 greater than the conventional art means that: (1) in the embodiment of FIG.

1, a height of the second black matrix 1162 correspondingly located above the source electrode S is the same as the conventional art, and a height of the second black matrix 1162 correspondingly located above the drain electrode D is greater than the conventional art; (2) a height of the second black matrix 1162 correspondingly located above the drain electrode D is the same as the conventional art, and a height of the second black matrix 1162 correspondingly located above the source electrode S is greater than the conventional art.

Wherein, the second color filter film 1152 and the second black matrix 1162 (located above the drain electrode D as shown in FIG. 1) form a protrusion column P, and the protrusion column P is higher than a top surface of the pixel electrode 117. Clearly, the present embodiment adopts a mask process of the color filter film and a mask process of the black matrix to form the protrusion column P, and using the protrusion column P to realize the function of the Sub PS so that a mask for manufacturing the Sub PS is not required in order to reduce the type and the number of the mask for manufacturing the PS, simplify the manufacturing process, and decrease the production cost.

For the color filter film 115 formed by a R (Red), a G (Green) and a B (Blue) color resists, the first color filter film 1151 includes the R, G and B color resists located on a same plane and formed by three exposure and development processes. The second color filter film 1152 can be formed by one of the three exposure and development processes. Using the second color filter film 1152 is formed by the exposure and development process of the B color resist as an example, coating a photoresist on the planarization passivation layer 114, drying in a vacuum, removing an edge photoresist, prebaking and cooling, exposing and developing, and baking again in order to form the higher B color resist in height correspondingly located above the TFT 112, lower B color resist in height is formed on the other portion of the planarization passivation layer 114. Wherein, the higher B color resist in height includes the first color filter film 1151 (below the dotted line in the figure) and the second color filter film 1152 (above the dotted line in the figure).

Because the black matrix 116 is disposed on the array substrate 11, the liquid crystal display panel 20 is a liquid crystal display panel that adopts a BOA (Black matrix on Array, integrating the black matrix to the array substrate) technology. Besides, because the color filter film 115 is disposed on the array substrate 11, the liquid crystal display panel 20 can also be a liquid crystal display panel that adopts a COA technology. It should be pointed out, the liquid crystal display panel 20 can dispose the common electrode 122 on a base 123 of the color filter substrate 12 as shown in the figure, or dispose the common electrode 122 on the array substrate 11, for example, the common electrode 122 and the pixel electrode 117 are disposed alternately on the array substrate 11. At this time, the liquid crystal display panel 20 can be regarded as an IPS (In-Plane Switching, a transverse electric field effect display) mode.

Of course, the array substrate 11 further has other structures of the conventional art, for example, a protective layer formed on the pixel electrode 117, not repeating any more.

Figure 2:
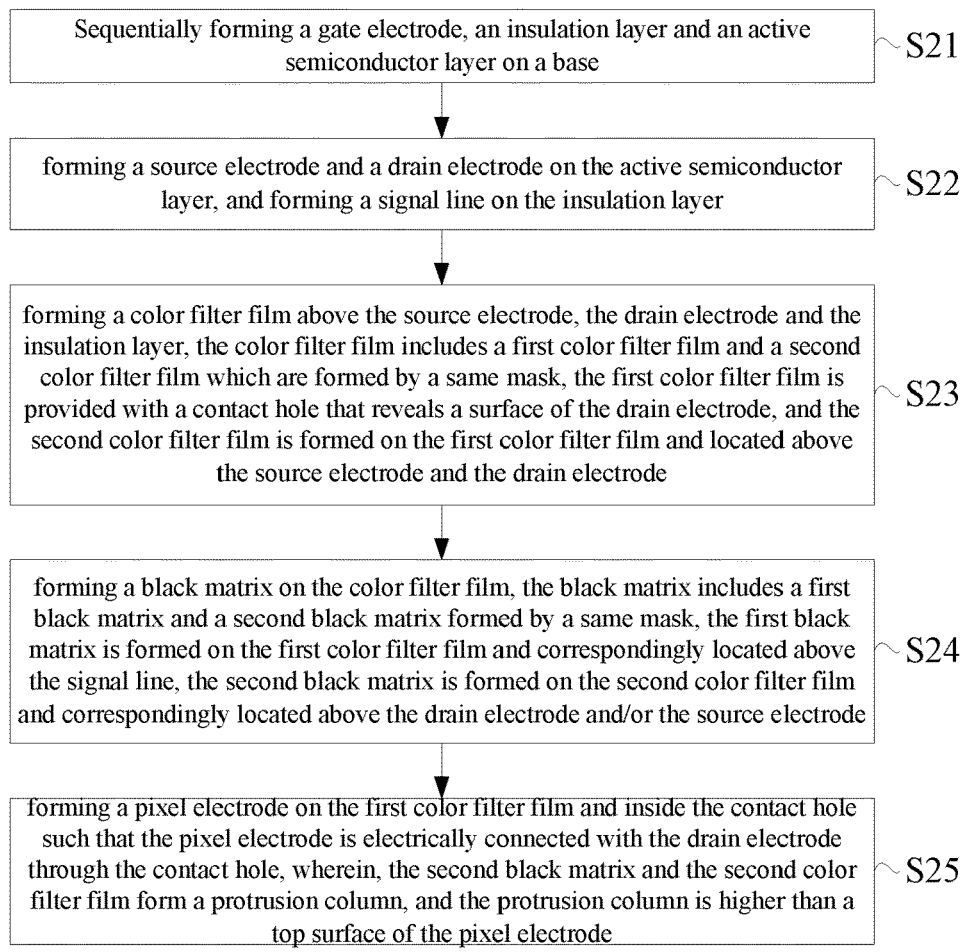
FIG. 2 is a flow chat of a manufacturing method of an array substrate of an embodiment of the present invention.

FIG. 2 is a flow chat of a manufacturing method of an array substrate of an embodiment of the present invention, for manufacturing the array substrate 11 as shown in FIG. 1. Combined with FIG. 1 to FIG. 3, the method includes:

S21: sequentially forming a gate electrode, an insulation layer and an active semiconductor layer on a base.

Figure 3:
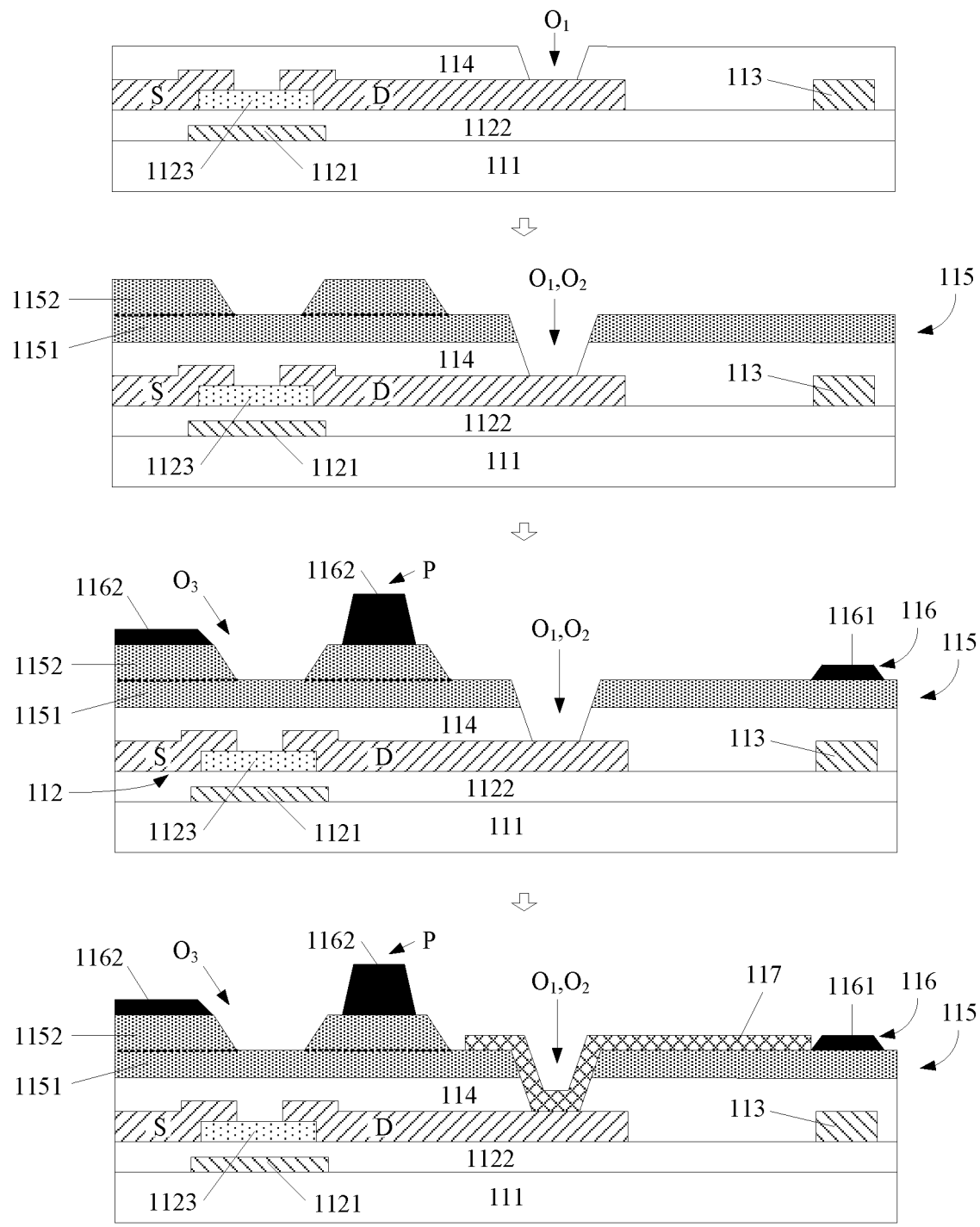
FIG. 3 is schematic diagram of using the manufacturing method shown in FIG. 2 to manufacture the array substrate.

As shown in FIG. 3, the base 111 is used for forming an array substrate 11 of the liquid crystal display panel 10, and the base 111 can be a glass base body, a plastic base body or a flexible base body.

The embodiment of the present invention can adopt methods such as the chemical vapor deposition, the vacuum evaporation, the Plasma Enhanced Chemical vapor deposition (PECVD) and the sputtering to form the gate electrode 1121 and the insulation layer 1122 and the active semiconductor layer 1123 on the base 111. In another embodiment, using two masks to respectively form the gate electrode 2111 having a preset pattern and an active semiconductor layer 1123.

S22: forming a source electrode and a drain electrode on the active semiconductor layer, and forming a signal line on the insulation layer.

With reference to FIG. 3, it can adopt a same mask to form the source electrode S, the drain electrode D and the signal line 113. That is, the source electrode S, the drain electrode D and the signal line 113 are formed through a same mask process. Of course, different mask processes can be adopted to form the source electrode S, the drain electrode D and the signal line 113.

S23: forming a color filter film above the source electrode, the drain electrode and the insulation layer, the color filter film includes a first color filter film and a second color filter film which are formed by a same mask, the first color filter film is provided with a contact hole that reveals a surface of the drain electrode, and the second color filter film is formed on the first color filter film and located above the source electrode and the drain electrode.

The embodiment of the present invention can form a planarization passivation layer 114 on the source electrode S, the drain electrode D, the signal line 113 and the insulation layer 1122. The planarization passivation layer 114 is provided with a first contact hole $O_1$ that reveals the surface of the drain electrode. Wherein, an etching solution including phosphoric acid, nitric acid, acetic acid and deionized water can be used to perform etching the planarization passivation layer 114 in order to obtain the planarization passivation layer 114 having the first contact hole $O_1$. Of course, a dry etching method can also be adopted. Then, forming the color filter film 115 on the planarization passivation layer 114, and the first color filter film 1151 of the color filter film 115 is provided with a second contact hole $O_2$ communicated with the first contact hole $O_1$.

S24: forming a black matrix on the color filter film, the black matrix includes a first black matrix and a second black matrix formed by a same mask, the first black matrix is formed on the first color filter film and correspondingly located above the signal line, the second black matrix is formed on the second color filter film and correspondingly located above the drain electrode and/or the source electrode.

Wherein, the step of forming the black matrix 116 specifically is: forming a light shielding layer having an entire surface on the color filter film 115; then, performing a patterning process to the light shielding layer in order to form the black matrix 116, wherein the patterning process is etching. The embodiment of the present invention can also adopt a mask to directly form the black matrix 116 as shown in the figure on the color filter film 115.

S25: forming a pixel electrode on the first color filter film and inside the contact hole such that the pixel electrode is electrically connected with the drain electrode through the contact hole, wherein, the second black matrix and the second color filter film form a protrusion column, and the protrusion column is higher than a top surface of the pixel electrode.

Of course, the array substrate 11 further has other structures of the conventional art. For example, array substrate 11 includes a protective layer for insulate the liquid crystal 13. Therefore, after forming the pixel electrode 117, the method further includes: forming a protective layer on the pixel electrode 117.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A manufacturing method for an array substrate, comprising:
   sequentially forming a gate electrode, an insulation layer and an active semiconductor layer on a base;
   forming a source electrode and a drain electrode on the active semiconductor layer;
   forming a signal line on the insulation layer;
   forming a planarization passivation layer on the source electrode, the drain electrode, the signal line and the insulation layer, and the planarization passivation layer is provided with a first contact hole that reveals a surface of the drain electrode;
   forming a color filter film above the source electrode, the drain electrode and the insulation layer, the color filter film includes a first color filter film and a second color filter film which are formed by a same mask, the first color filter film is provided with a second contact hole communicated with the first contact hole to reveal the surface of the drain electrode, and the second color filter film is formed on the first color filter film and located above the source electrode and the drain electrode; and
   forming a black matrix on the color filter film, the black matrix includes a first black matrix and a second black matrix formed by a same mask, the first black matrix is formed on the first color filter film and correspondingly located above the signal line, the second black matrix is formed on the second color filter film and correspondingly located above the drain electrode and/or the source electrode;
   wherein the second black matrix and the second color filter film form a protrusion column functioned as a sub photo spacer, and the protrusion column is higher than a top surface of the pixel electrode;
   wherein the second color filter film is provided with a groove that reveals a surface of the first color filter film for receiving a main photo spacer, a location of the groove is corresponding to a thin-film transistor, the main photo spacer is located on a color filter substrate spaced relative to the array substrate, and the main photo spacer is contacted with the first color filter; and
   wherein the protrusion column is adjacent to the main photo spacer, and a gap is existed between the protrusion column and the color filter substrate.

2. The method according to claim 1, wherein, the first color filter film includes R, G and B color resists located on a same plane and formed by three exposure and development processes, and the second color filter film is formed by one of the three exposure and development processes.

3. The method according to claim 1, wherein, the source electrode, the drain electrode and the signal line are formed by a same mask.

4. An array substrate, comprising:
   a base;
   a gate electrode, an insulation layer, an active semiconductor layer which are sequentially formed on the base;
   a source electrode and a drain electrode formed on the active semiconductor layer;
   a signal line formed on the insulation layer;
   a planarization passivation layer formed on the source electrode, the drain electrode, the signal line and the insulation layer, and the planarization passivation layer is provided with a first contact hole that reveals a surface of the drain electrode;
   a color filter film formed above the source electrode, the drain electrode and the insulation layer, wherein the color filter film comprises a first color filter film and a second color filter film which are formed by a same mask, the first color filter film is provided with a second contact hole communicated with the first contact hole to reveal the surface of the drain electrode, the second color filter film is formed on the first color filter film, and the second color filter film is located above the source electrode and the drain electrode;
   a black matrix formed on the color filter film, wherein the black matrix comprises a first black matrix and a second black matrix formed by a same mask, the first black matrix is formed on the first color filter film, and correspondingly located above the signal line, the second black matrix is formed on the second color filter film, and correspondingly located above the drain electrode and/or the source electrode; and
   a pixel electrode formed on the first color filter film and inside the contact hole, and the pixel electrode is electrically connected with the drain electrode through the contact hole;
   wherein the second black matrix and the second color filter film form a protrusion column functioned as a sub photo spacer, and the protrusion column is higher than a top surface of the pixel electrode;
   wherein the second color filter film is provided with a groove that reveals a surface of the first color filter film for receiving a main photo spacer, a location of the groove is corresponding to a thin-film transistor, the main photo spacer is located on a color filter substrate spaced relative to the array substrate, and the main photo spacer is contacted with the first color filter; and
   wherein the protrusion column is adjacent to the main photo spacer, and a gap is existed between the protrusion column and the color filter substrate.

5. The array substrate according to claim 4, wherein, the first color filter film includes R, G and B color resists located on a same plane and formed by three exposure and development processes, and the second color filter film is formed by one of the three exposure and development processes.

6. The array substrate according to claim 4, wherein, the source electrode, the drain electrode and the signal line are formed by a same mask.

7. A liquid crystal display panel, wherein, the liquid crystal display panel comprises a first substrate and a second substrate which are disposed at an interval and a liquid crystal filled between the first substrate and the second substrate, wherein, one of the first substrate and the second substrate is an array substrate, and the array substrate comprises:
   a base;

a gate electrode, an insulation layer, an active semiconductor layer which are sequentially formed on the base;
a source electrode and a drain electrode formed on the active semiconductor layer;
a signal line formed on the insulation layer;
a planarization passivation layer formed on the source electrode, the drain electrode, the signal line and the insulation layer, and the planarization passivation layer is provided with a first contact hole that reveals a surface of the drain electrode;
a color filter film formed above the source electrode, the drain electrode and the insulation layer, wherein the color filter film comprises a first color filter film and a second color filter film which are formed by a same mask, the first color filter film is provided with a contact hole communicated with the first contact hole to reveal the surface of the drain electrode, the second color filter film is formed on the first color filter film, and the second color filter film is located above the source electrode and the drain electrode;
a black matrix formed on the color filter film, wherein the black matrix comprises a first black matrix and a second black matrix formed by a same mask, the first black matrix is formed on the first color filter film, and correspondingly located above the signal line, the second black matrix is formed on the second color filter film, and correspondingly located above the drain electrode and/or the source electrode; and
a pixel electrode formed on the first color filter film and inside the contact hole, and the pixel electrode is electrically connected with the drain electrode through the contact hole;
wherein the second black matrix and the second color filter film form a protrusion column functioned as a sub photo spacer, and the protrusion column is higher than a top surface of the pixel electrode;
wherein the second color filter film is provided with a groove that reveals a surface of the first color filter film for receiving a main photo spacer, a location of the groove is corresponding to a thin-film transistor, the main photo spacer is located on a color filter substrate spaced relative to the array substrate, and the main photo spacer is contacted with the first color filter; and
wherein the protrusion column is adjacent to the main photo spacer, and a gap is existed between the protrusion column and the color filter substrate.

8. The liquid crystal display panel according to claim 7, wherein the first color filter film includes R, G and B color resists located on a same plane and formed by three exposure and development processes, and the second color filter film is formed by one of the three exposure and development processes.

9. The liquid crystal display panel according to claim 7, wherein the source electrode, the drain electrode and the signal line are formed by a same mask.

\* \* \* \* \*